(12) United States Patent
Mayo et al.

(10) Patent No.: US 6,704,669 B2
(45) Date of Patent: Mar. 9, 2004

(54) METHOD FOR DETERMINING VOLTAGE, CURRENT, AND/OR POWER DISTRIBUTIONS IN A RESISTIVE STRUCTURE USING A RECTANGULAR GRID ALGORITHM MODIFIED FOR NON-RECTANGULAR HOLES AND CONTACTS

(75) Inventors: Anita A. Mayo, Chappaqua, NY (US); Barry J. Rubin, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 293 days.

(21) Appl. No.: 09/840,980

(22) Filed: Apr. 25, 2001

(65) Prior Publication Data

US 2003/0028337 A1 Feb. 6, 2003

(51) Int. Cl.$^7$ .................................................. H03H 1/02
(52) U.S. Cl. .............................. 702/64; 702/57; 702/60; 702/62; 702/65; 702/133
(58) Field of Search .............................. 702/57, 60, 62, 702/64, 65, 133, FOR 103–FOR 104, FOR 106, FOR 111, FOR 155; 257/202, 207, 208, 209, 210, 211, 212, 773, 774, 776; 361/791, 792, 794, 795; 307/17, 18, 19, 29, 31, 85

(56) References Cited

U.S. PATENT DOCUMENTS

| | | | | |
|---|---|---|---|---|
| 5,311,058 A | * | 5/1994 | Smolley | 257/691 |
| 6,118,334 A | * | 9/2000 | Tanaka et al. | 327/565 |
| 6,202,191 B1 | * | 3/2001 | Filippi et al. | 716/5 |
| 6,215,373 B1 | * | 4/2001 | Novak et al. | 333/22 R |
| 6,306,744 B1 | * | 10/2001 | Aldrich | 438/599 |
| 6,308,307 B1 | * | 10/2001 | Cano et al. | 716/8 |
| 6,525,622 B1 | * | 2/2003 | Novak et al. | 333/32 |
| 2002/0112212 A1 | * | 8/2002 | Cohn et al. | 716/1 |

OTHER PUBLICATIONS

I.S. Duff, et al., Directy Methods for Sparse Matrices; Oxford Science Publications; Chapter 3—Gaussian elimination for dense matrices; the algebraic problem, pp. 41–61; and Chapter 5—Gaussian elimination for sparse matrices: an introduction, pp. 93–104.

G. Dhatt et al., "The Finite Element Method Displayed," Sections 1.0—Approximations with Finite Elements pp. 9–21; Section 1.5 Transformation of Differential Operators, pp. 42–50; and Section 2.5—Tetrahedrons (Three–Dimensional), pp. 110–121.

N. Balabanian et al., "Graph Theory and Network Equations (Chapter 2)," Electrical Network Theory; pp. 58–81.

C.M. Sakkas; Potential Distribution and Multi–Terminal DC Resistance Computations for LSI Technology; IBM J. Res. Develop. vol. 24, No. 6, Nov. 1979, pp. 640–651.

R.V. Viswanathan et al., Solution of Poisson's Equation by Relaxation Method—Normal Gradient Specified on Curved Boundaries; pp. 67–78.

* cited by examiner

Primary Examiner—Marc S. Hoff
Assistant Examiner—Carol S. Tsai
(74) Attorney, Agent, or Firm—Whitham, Curtis & Christofferson, P.C.; Stephen C. Kaufman (57) ABSTRACT

The method of the present invention determines the voltage, current, and/or power distribution in a power supply or other resistive network containing holes or contacts having non-rectangular boundaries. The method includes applying a grid over the resistive network. Because the holes and contacts have non-rectangular boundaries, the grid lines are not always coincident with these boundaries. A set of modified finite difference equations are then solved to derive a voltage distribution. Unlike conventional methods, these equations have been specifically adapted to the non-rectangular boundaries of the holes and contacts.

7 Claims, 12 Drawing Sheets

METHOD FOR DETERMINING VOLTAGE, CURRENT, AND/OR POWER DISTRIBUTIONS IN A RESISTIVE STRUCTURE USING A RECTANGULAR GRID ALGORITHM MODIFIED FOR NON-RECTANGULAR HOLES AND CONTACTS

BACKGROUND OF THE INVENTION

1. Field of the Invention

This invention generally relates to power supply networks, and more particularly to a method for determining voltage and current distributions in a power supply network when known voltages and currents are applied.

2. Description of the Related Art

Numerical methods for approximating voltage and current distributions in a power supply network have been proposed. One class of methods are known as finite difference methods. Most often these methods are used to determine voltage and current distributions when contacts and holes in the network have rectangular boundaries. By rectangular boundaries, we mean boundaries composed of straight lines which are either parallel or perpendicular to each other. See, for example, Balabanian et al., *Electrical Network Theory*, John Wiley and Sons, New York, 1968.

In implementing this method, it is assumed that the network is composed of disjoint sub-regions with distinct, constant resistivities. The entire region is then covered with a rectangular grid of intersecting horizontal and vertical lines. The grid lines are required to include the boundaries of all the holes and contacts in the network, as well as the boundaries between all sub-regions. The voltage values at the grid points are then determined by requiring them to satisfy a sparse linear system of equations arising from a discrete approximation to conservation of current and Ohm's law. These equations are also disclosed in the aforementioned Balabanian publication. The coefficients of the equations depend on a "numerical conductance," which in turn depends on the physical resistance near a grid point and the distances between nearby grid points.

The Inventors of the present application have discovered that the standard finite difference method does not produce an accurate voltage distribution approximation when the network includes holes and contacts with non-rectangular boundaries, unless a very fine grid is used to approximate non-rectangular boundaries. This is because the standard finite difference method does not take into account the precise geometry of non-rectangular holes and contacts, such as boundary direction and/or curvature, and are therefore less accurate.

A contact or hole with a non-rectangular boundary can be approximated using a very fine rectangular mesh, however this technique has also proven undesirable. Very fine rectangular meshes, for example, greatly increase the number of mesh lines. This, in turn, increases the number of grid points in the problem, which then increases the size of the problem which must be solved. And, as a result of this increased complexity, greater amounts of computer time are needed to solve the problem.

Finite element methods have also been used for solving resistance problems on regions with non-rectangular boundaries. See, for example, Sakkas, *Potential Distribution and Multi-Terminal DC Resistance for LSI Technology*, IBM J. Res, Devel., vol. 23, No. 6, page 640, 1979. These methods are not well suited to solving resistance problems, since the problems often contain long narrow holes. Finite element discretizations of such regions would therefore contain triangles with high aspect ratios. The presence of such triangles decreases the accuracy of the finite element method.

A need therefore exists for an improved numerical method of approximating voltage and current distributions in a power supply network, and moreover one which accurately approximates voltage and current distributions in a resistive network which includes holes or contacts with non-rectangular boundaries.

SUMMARY OF THE INVENTION

It is one object of the present invention to provide an accurate and efficient method for approximating voltage and current distributions in a power supply network.

It is another object of the present invention to achieve the aforementioned object by solving the resistance problem in a power supply network using a modification of a rectangular grid algorithm which approximates current and voltage distributions in a structure having holes and/or contacts with non-rectangular boundaries. These boundaries may be arbitrary shapes, circles, ellipses, or any other shape that is not rectangular. By non-rectangular, we mean contacts or holes whose boundaries are not composed of straight lines which are parallel to grid lines.

The foregoing and other objects of the invention are achieved by providing a method for approximating voltage, current, and/or power distributions in a power supply network which includes a structure having non-rectangular holes and contact regions where specific voltage or current sources are attached to drive the structure. The method includes parsing a resistive region of the structure into rectangles, applying a grid over the parsed resistive region, locating grid points near non-rectangular holes and contacts, generating standard finite difference equations at points not near the non-rectangular holes or contacts, generating specially modified finite difference equations at points near non-rectangular holes and contacts, solving the resulting linear system of equations, and then deriving voltages at the grid points based on solutions to the standard and modified finite difference equations. Current and power distributions may then be derived from this voltage distribution. The method advantageously may be applied to resistive regions having discontinuous or different material resistivities. As a result this method, a more accurate approximation of these distributions are obtained when the resistive region contains holes or contacts with non-rectangular boundaries than when the finite difference equations are not modified.

DESCRIPTION OF THE PREFERRED EMBODIMENTS

The present invention is a method for approximating voltage, current, and/or power distributions in a structure, such as a power supply network, having a resistance region which includes at least one conductor or contact with a non-rectangular boundary. Typically, the conductor or contact is attached to a voltage or current source for driving the device.

Figure 1:
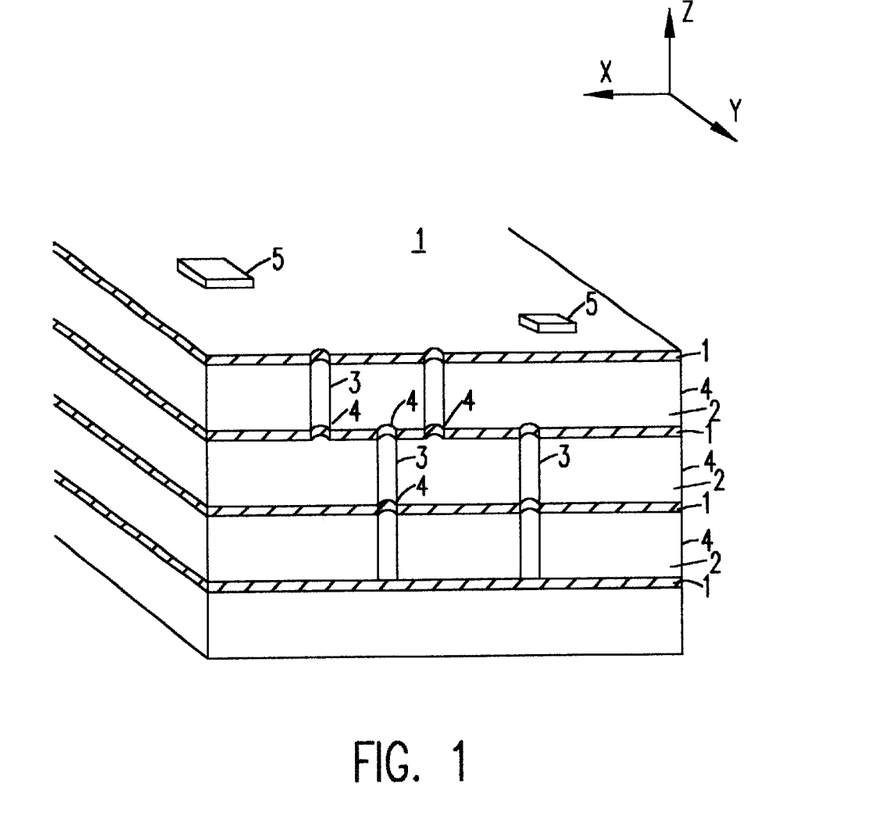
FIG. 1 is a diagram of an illustrative resistive structure containing non-rectangular holes or contacts for which a voltage distribution may be determined in accordance with the method of the present invention.

FIG. 1 shows a structure of this type. The integrated circuit board may include, but is not limited to, thin conductive sheets 1, stacked in the z direction in a Cartesian coordinate system, and insulated from each other by non-conductive material 2. The conductive layers of the same voltage are connected through vias 3. When a via does not connect to a conductive layer, the conductive material on that layer near the via is removed so that the via can pass through without making connection to the layer. This removed conductive material forms a hole 4. The contacts 5 are generally located on only the outer-most conductive layers, and are connected to their associated conductive layers through vias. The power supplies and one or more chips 5 to be mounted on the board may be represented by contacts on the sheets that are tied to voltage sources, current sources, resistance elements, or any combination thereof.

The method of the present invention solves the problem of finding voltage, current, and/or power distributions associated with the applied sources in a structure such as in FIG. 1 by modifying a rectangular grid algorithm so that it approximates these distributions when one or more of the voltage contacts or holes have non-rectangular boundaries. These non-rectangular boundaries may include, for example, arbitrary shapes, circles, ellipses, or any other shape whose boundaries are not composed of straight lines that a parallel to grid lines. More specifically, the invention modifies finite difference equations, conventionally used for solving resistance network problems for resistive contacts and holes to solve problems for contacts and holes that have non-rectangular boundaries. (It also may be assumed that, in accordance with one embodiment, the structure includes thin multiple layers stacked in the z direction in a Cartesian coordinate system interconnected through holes running in the z-direction.)

Figure 2:
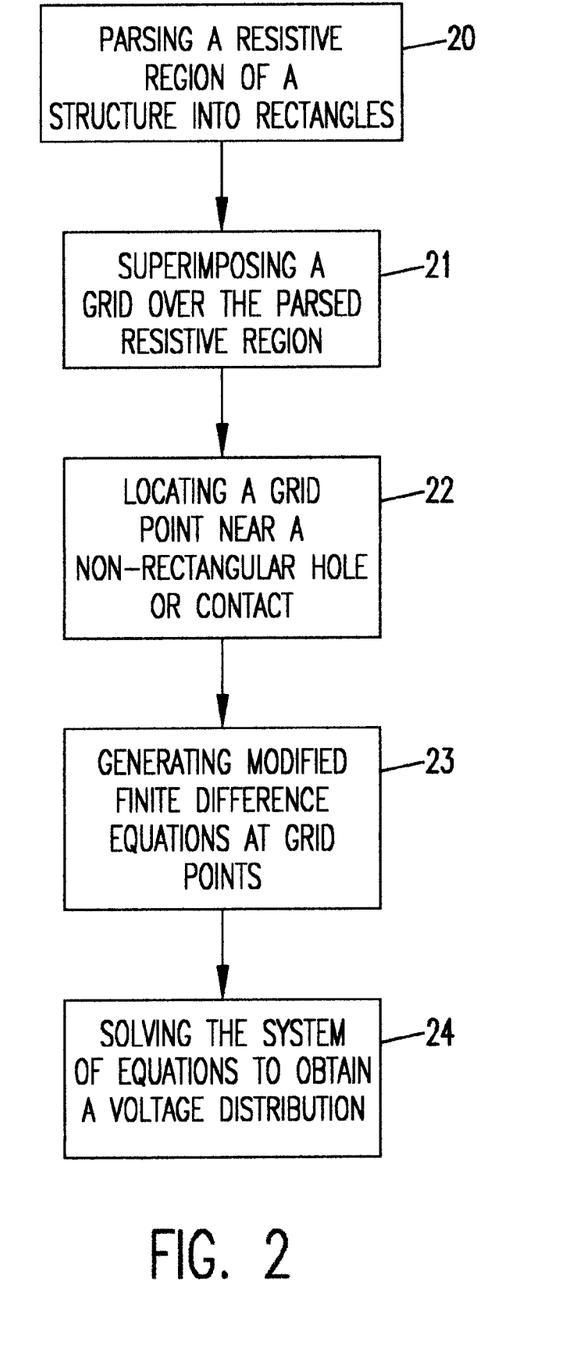
FIG. 2 is a flow diagram showing steps included in a preferred embodiment of the method of the present invention.

FIG. 2 is a flow diagram showing steps included in a preferred embodiment of the method of the present invention. The method begins by parsing the resistive region of the structure containing the contacts and holes into rectangles. (Block 20). This region is then covered with a rectangular grid. (Block 21). As in standard methods, the grid is such that interfaces between sub-regions lie on grid lines. The only other requirement in applying the grid is that if a grid point has two neighboring grid points in a hole, the neighboring grid point in the direction diagonally opposite to the hole is not in another hole as shown, for example, in FIG. 11, to be explained in detail below.

A third step of the method includes locating grid points which lies near a contact or hole having a non-rectangular boundary. (Block 22). A grid point may be considered to be near a non-rectangular hole or contact if one of its neighboring grid points lie in the hole or contact.

A fourth step includes generating finite difference equations at all grid points. (Block 23). In the fifth step, the voltages are determined by solving these equations which represent a modification of the ones used when the boundaries of the holes and contacts are rectangular. (Block 24). Unlike conventional finite difference equations, which represent the holes or contacts as having boundaries with rectangular sides regardless of their actual shapes, the equations of the present invention take the precise geometry of the holes and contacts into consideration. For example, if a hole or contact is elliptical in shape, the equations solved depend on this specific shape. The same is true for a circular geometry as well as other types of non-rectangular geometries.

To achieve this objective, at grid points near non-rectangular holes the present invention uses equations that might be compared with Viswanathan equations. Viswanathan presents finite difference equations that can be used for solving Poisson's equation in two dimensions $\nabla\nabla U = f$ when the normal derivative of U is specified on a curved boundary. This equation is like the equation the voltage satisfies when the resistivity is equal to a fixed constant everywhere. Viswanathan equations are disclosed in Viswanathan, *Solution of Poisson's Equation by Relaxation Method-Normal Gradient Specified on Boundary Curve*, Mathl. Tabl. Natl. Res. Coun., Wash. 11, 67, 1957, and similar equations are discussed in Ames, *Numerical Methods for Partial Differential Equations*, Academic Press, New York 1977.

Viswanathan equations and the equations of the present invention are derived using polynomial series expansions of the solution in the neighborhood of a grid point. That is, both methods use the boundary conditions and their derivatives, as well as the differential equation, to determine the coefficients in the polynomial expansion. These coefficients are then used to determine the discretization Also, in regions where the material resistance is constant and where the grid is uniform and the same in all directions, the coefficients are the same.

However, as the following discussion makes clear, the equations of the present invention are significantly different from Viswanathan equations in several respects. First, the equations of the present invention are used to perform resistance calculations. Viswanathan equations have never been used for this or any other similar purpose. Second, the equations of the present invention approximate voltage, current, or power distributions in regions where the material resistivity is discontinuous. Viswanathan equations are inherently limited in this respect, i.e., Viswanathan equations may only be used for continuous coefficients and therefore only apply when the resistivity is constant. More precisely, the derivation used by Viswanathan applies the following potential function V is expressed as a single polynomial expansion $$V(x,y) = v_0 + px + qy + bx^2 + 2fxy + cy^2$$

One drawback of Viswanathan's method is that no single polynomial series expansion is valid when the resistivity is discontinuous. This is a significant limitation of the Vaswanathan approach, since structures are normally composed of several different sub-regions with different resistivities. In contrast, the method of the present invention uses different expansions in regions with different resistivities, and is valid in regions with discontinuous resistivity. The invention, thus, represents a significant improvement over the Viswanathan approach and other conventional methods of solving problems in resistance networks.

The Viswanathan equations also require the grid not only to be uniform in each direction, but also the same in all coordinate directions. No such restriction applies to the equations of the present invention.

When the grid point has a neighboring grid point in a voltage contact, the equations which the voltage must satisfy in conventional methods corresponds to Dirichlet (fixed voltage) boundary conditions. When the resistivity is constant in the neighborhood of a point, the formula used by the invention may be the same as the Shortley Weller formula. See, for example, Forsythe et al., *Finite Difference Methods for Partial Differential Equations*, Wiley, New York 1960, and Proskurowski, et al., *On the Numerical Solution of Helmholtz's Equation by the Capacitance Matrix Method*, Math. Comp. 30, 433, 1976, and the Ames article already referenced herein. The specific approach taken by the present invention and the equations specifically used will now be described.

The method of the present invention requires the voltage values at the grid points to satisfy certain finite difference equations. At grid points near rectangular holes or contacts, standard equations are used. However, at grid points near non-rectangular holes and voltage contacts, the standard equations are significantly modified to accurately determine the voltage distribution.

Standard Equations for Rectangular Contacts and Holes

Figure 3:
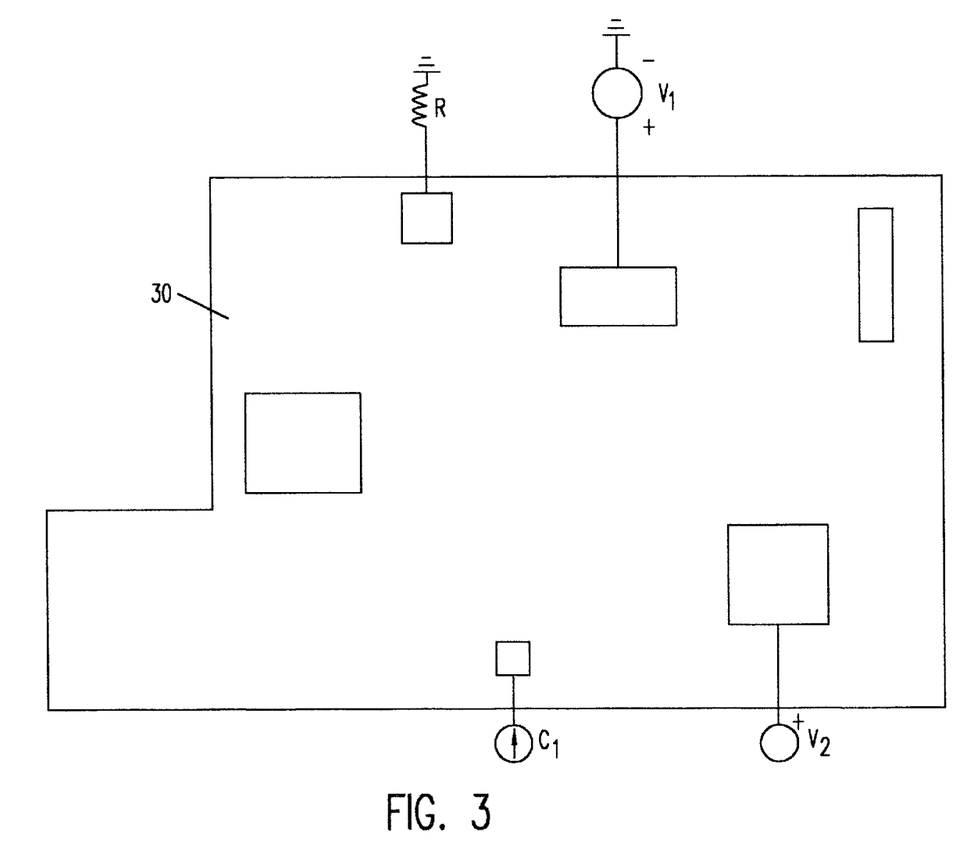
FIG. 3 is a schematic diagram of a two-dimensional resistive region containing holes and contacts with rectangular boundaries.

A standard set of equations is used when boundaries of the contacts and current sources in the network are rectangular. FIG. 3 shows a two-dimensional structure to which these equations may be applied. This structure includes a resistive region 30, voltage sources $V_1$ and $V_2$, a current source $C_1$, and various regions containing rectangular holes and/or contacts, some of which are connected to the voltage and current sources. The method is then implemented as follows.

1) Each two-dimensional structure is parsed into rectangles. A surface resistance is then assigned to each two-dimensional rectangle. Each voltage source is assumed to provide a defined voltage over the rectangular region with which it is associated. One voltage source is assigned a reference voltage value $V_0$, and if there are other sources they are assigned voltages relative to that value. Current sources are assumed to provide a constant current over a rectangular region.

2) A rectangular array of grid points is defined, based on the locations of the vertices of each rectangle. Grid lines along the x, y, and z directions are defined such that all rectangle vertices fall on an x grid line, a y grid line, and a z grid line. In three-dimensional structures, the grid lines along each direction are actually planes. For example, the grid line $x_1$ is a y–z plane running through the point $x=x_1$. Each grid point will be referred to as a node.

Figure 4:
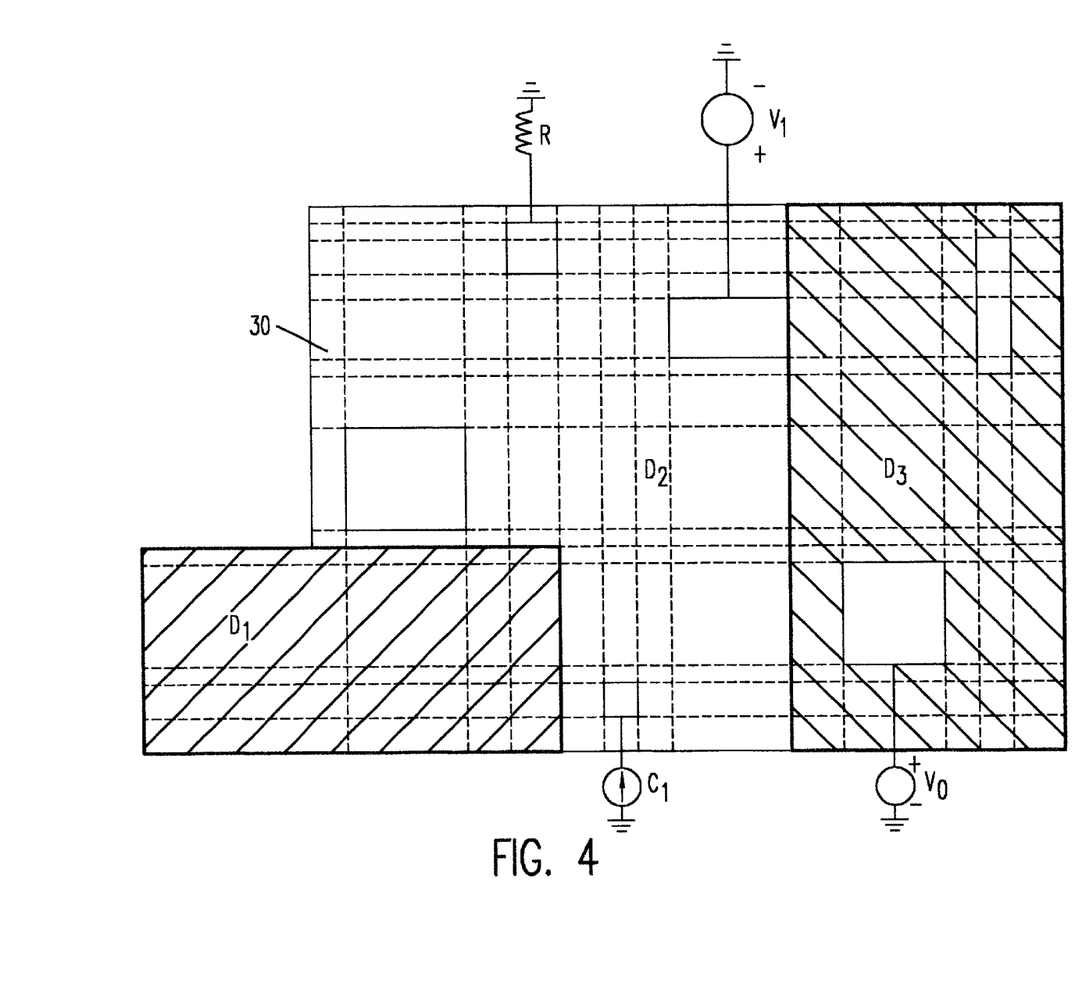
FIG. 4 is a diagram showing a grid formed over the resistive region shown in FIG. 3.

FIG. 4 shows an example of grid lines for a two-dimensional structure. In this figure, the sources $V_0$, $V_1$, and $C_1$ are represented by an appropriate voltage or current defined at each node in the source region. (Here, a node corresponds to a grid point). Each node in a rectangle associated with a current source may be assigned a certain weighted portion of the total current associated with the rectangle. The material in the network is assumed to be composed of disjoint sub-regions $D_k$ with distinct, constant resistivities $\rho_k$.

3) By standard finite difference techniques such as disclosed in the Balabanian publication previously mentioned, a numerical conductance is calculated between each pair of adjacent nodes, where nodes are adjacent in the x, y, or z directions. The numerical conductance depends on the material resistivity and the spacings between the grid lines in the vicinity of the node pair, as will now be explained in greater detail.

Figure 5:
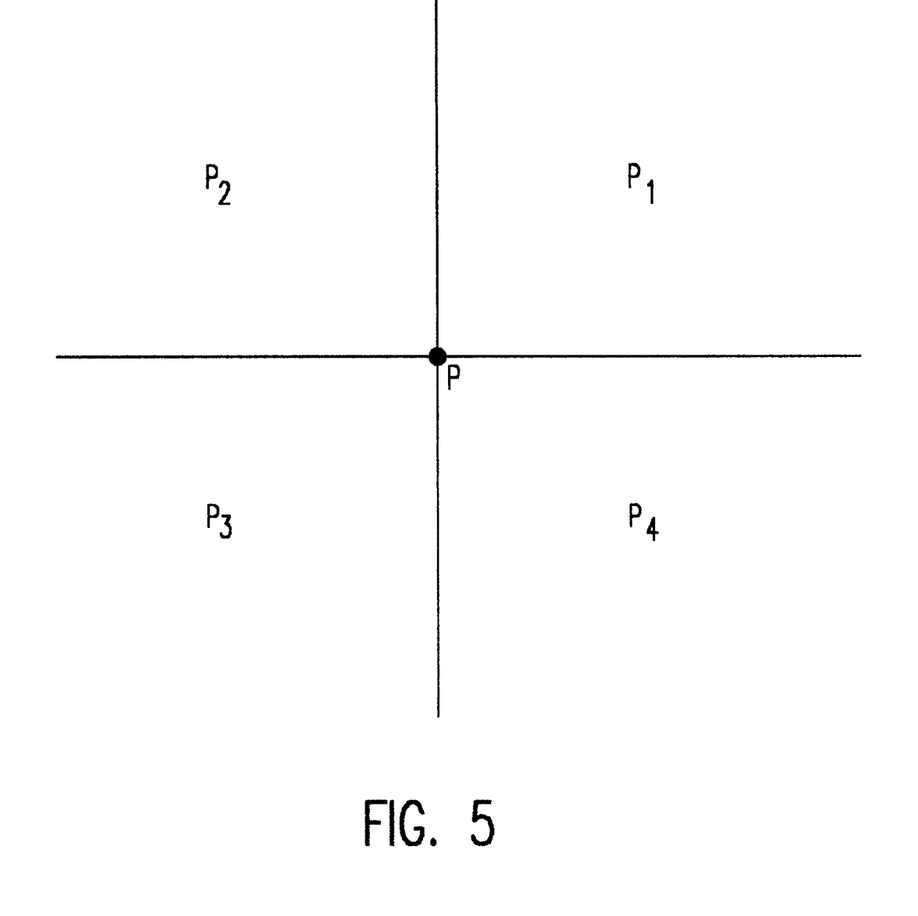
FIG. 5 is a diagram showing resistivities in regions surrounding a grid point.

Consider the example of a board in the x–y direction, i.e., a board with a constant z dimension. Denote the grid points in this plane as $p_{ij}=(x_i, y_j)$ and distances between consecutive grid points as $h_i=x_{i+1}-x_i$, and $k_j=y_{j+1}-y_j$. If the resistivities $\rho_1, \rho_2, \rho_3, \rho_4$ in the four grid boxes around a point $p_{ij}$ are as in FIG. 5, then the conductances between p and its neighboring grid points are given by:

$$G_{i+1,j} = \frac{(k_j + k_{j+1})}{(\rho_1 + \rho_4)h_{i+1}},\ G_{i-1,j} = \frac{(k_j + k_{j+1})}{(\rho_2 + \rho_3)h_i} \quad (1)$$

$$G_{i,j+1} = \frac{(h_i + h_{i+1})}{(\rho_1 + \rho_2)k_{j+1}},\ G_{i,j-1} = \frac{(h_i + h_{i+1})}{(\rho_3 + \rho_4)k_j}$$

At each grid point, the voltage is required to satisfy an equation which depends on the numerical conductances. Specifically, voltages $V_{ij}$ at point $p_{ij}$ is required to satisfy the equation:

$$(V_{i+1,j}-V_{ij})G_{i+1,j}+(V_{i-1,j}-V_{ij})G_{i-1,j}+(V_{ij+1}-V_{ij})G_{ij+1}+(V_{ij-1}-V_{i,j})G_{ij-1} = I_{ij} \quad (2)$$

where $I_{ij}$ is the current at the (i,j) node. The aforementioned equations are used to form an n by n matrix where n is the number of nodes in the material.

4) Boundary conditions are applied to the matrix based on the voltages or currents of the nodes associated with the sources.

a) The right-hand side of the equation $I_{ij}$ is only nonzero at nodes where there is current, so at most nodes $I_{ij}=0$.

b) If the voltage is specified at a node, then equations involving this node are changed, bringing the known voltage to the right-hand side of the equation. For example, if the voltage $V_{i+1,j}=V_c$ is specified at a node $x_{i+1,j}$, then equation (2) is replaced by:

$$-V_{ij}G_{i+1,j}+(V_{i-1,j}-V_{ij})G_{i-1,j}+(V_{ij+1}-V_{ij})G_{ij+1}+(V_{ij-1}-V_{i,j})G_{ij-1}=I_{ij}-V_cG_{i+1,j}$$

where the numerical conductances are the same.

c) Finally, if one of the four neighboring nodes of a given node is either in a hole or not part of the structure, then the part of the matrix associated with the neighboring node is eliminated. For example, if the node (i+1,j) is not in the structure, then equation (2) is replaced by:

$$(V_{i-1,j}-V_{i,j})G_{i-1,j}+(V_{ij+1}-V_{ij})G_{ij+1}+(V_{ij-1}-V_{i,j})G_{ij-1}=I_{ij}$$

5) The matrix equation generated above is solved using standard techniques, which is usually a direct sparse matrix solution or an appropriate iterative technique, depending on storage, speed, and accuracy requirements. The direct sparse matrix solution is known in the art. See, for example, Duff et al., Direct Methods for Sparse Matrices, Clarendon Press, Oxford, 1988.

Figure 6:
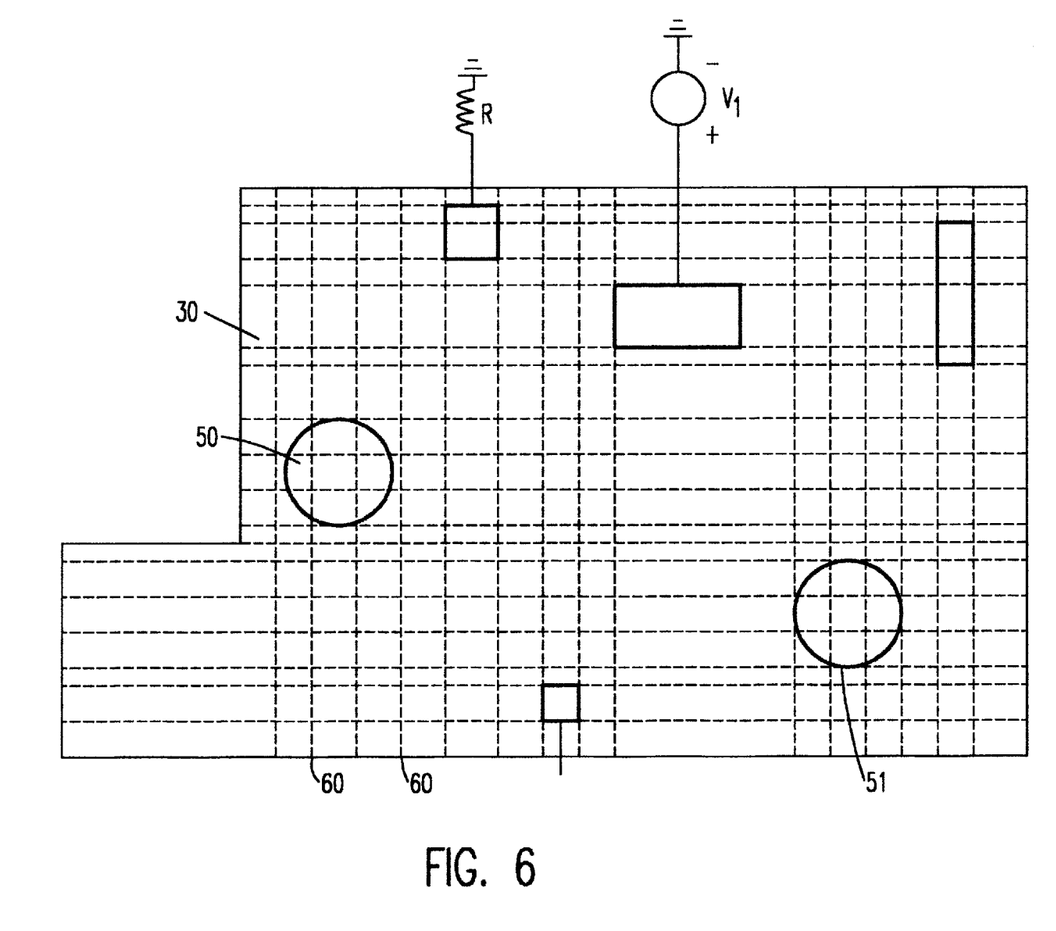
FIG. 6 is a diagram showing grid lines applied over a two-dimensional resistive region containing holes and/or contacts with non-rectangular boundaries.

Modified Finite Difference Equations Applied to Non-rectangular Contacts/Holes Now, we describe the equations used by the present invention to solve resistance problems for structures with non-rectangular holes or contacts. It is noted that the equations are solved after the network structure is, first, parsed into rectangles as in 1) above. Second, the grid is applied in the same way as 2) in the Standard Equations section above, except that grid lines do not always coincide with the edges. For example, as shown in FIG. 6, contact holes 50 and 51 are not aligned with grid lines 60.

Suppose, for example, that the contact or hole has a circular boundary centered at the point $(c_x, c_y)$ of radius r. (Those skilled in the art can appreciate that a different assumption may be made for holes or contacts with non-rectangular boundaries which are not circular.) Then:

a) grid lines are generated which circumscribe the circle, with one grid line above, one below, one to the left, and one to the right of the circle as follows:

$x=c_x+r, x=c_x-r, y=c_y+r$, and $y=c_y-r$.

b) the following four vertical and horizontal lines are then generated as follows: $x=c_x+r/2$, $x=c_x-r/2$, $y=c_y+r/2$, and $y=c_y-r/2$. See FIG. 7.

Similarly, if the region is an ellipse centered at $c_x, c_y$, then the following lines are generated:

| | |
|---|---|
| x = $c_x$ + a | y = $c_y$ + b |
| x = $c_x$ − a | y = $c_y$ − b |
| x = $c_x$ + a/2 | y = $c_y$ + b/2 |
| x = $c_x$ − a/2 | y = $c_y$ − b/2 |

Third, modified finite difference equations in accordance with the present invention are solved. That is, at each grid point, an equation is formed which the voltage must satisfy. Standard finite difference equations are used at points which are not near non-rectangular holes or contacts, and modified equations are used at points which are near such regions. The modified equations correspond to finite difference schemes for solving elliptical differential equations on non-rectangular regions. In particular, when a grid point has a neighboring grid point in a hole, the equation the voltage V must satisfy is the discretization of an elliptical differential equation $$\nabla \frac{1}{\rho} \nabla V = f$$

with homogeneous Neumann data, $$\frac{1}{\rho} \frac{\partial V}{\partial n} = 0$$

specified on the boundary of the hole.

$\left(\text{Here, } \rho \text{ is the resistivity,} \right.$ $\frac{\partial V}{\partial n}$ is the normal derivative of the voltage, and $f$ is the current.$\left.\right)$ Thus, at each grid point, an equation is formed which the voltage must satisfy. Recalling the that material in the network is assumed to be composed of disjoint sub-regions $D_k$ with distinct, constant resistivities $\rho_k$, then at nodes whose four neighboring nodes are not in a hole or contact equation (2) is used with $G_{ij}$ as defined in equation (1). The equation that the voltage satisfies at the other nodes, which have a neighboring node in either a hole or a contact region, will now be specified.

Non-rectangular Voltage Contacts

Figure 7:
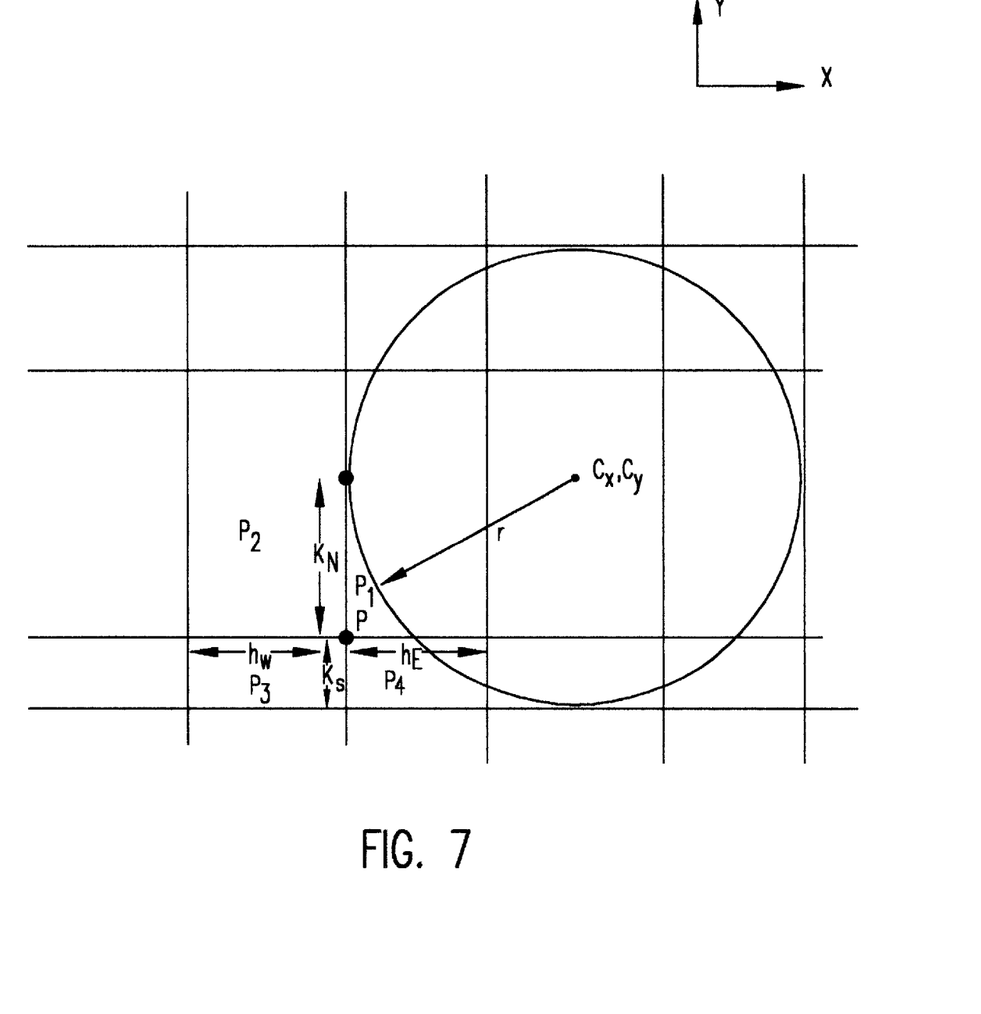
FIG. 7 is a diagram showing a grid spacing in the vicinity of a grid point near a non-rectangular hole or contact such as shown in FIG. 6.

Suppose that at least one neighboring node of a point $p=p_{ij}$ is in a voltage contact. Let $h_E$, $h_W$, $k_N$, and $k_S$ denote the distances in the x and y directions to either the nearest node, if that node is the material, or if that node is on the contact, the distance to the contact. See FIG. 7. Then, at p, the voltage is required to satisfy the equation (2), but where now:

$$G_{i+1,j} = \frac{(k_N + k_S)}{(\rho_1 + \rho_4)h_E}, G_{i-1,j} = \frac{(k_N + k_S)}{(\rho_2 + \rho_3)h_W}$$

$$G_{i,j+1} = \frac{(h_E + h_W)}{(\rho_1 + \rho_2)k_N}, G_{i,j-1} = \frac{(h_E + h_W)}{(\rho_3 + \rho_4)k_S}$$

Of course, the value of the voltage at at least one of the neighboring nodes $V_{i-1,j}$, $V_{i-1,j}$, $V_{ij-1}$ and $V_{ij+1}$ is fixed.

Non-rectangular Holes

In accordance with the present invention, the equations are modified when at least one of the neighboring nodes of a node p lies in a hole. For simplicity, it is assumed that the entire hole is contained in a single sub-region. Here, different equations are used depending upon a number of factors. Specifically, different equations are used when the point p has one or two neighboring grid points in a hole. In addition, the equations depend on the resistivities in the sub-regions surrounding p.

In applying these equations the boundary conditions (i.e., fixed current or voltage values) are dealt with in exactly the same way as described in the Standard Equations section above. And, once the matrix is formed and boundary conditions are applied, the system of equations is solved as in 5) of the Standard Equations section above. The equations will now be explained in terms of the following illustrative situations.

One Neighboring Grid Point Lies in Hole. First, suppose that only one neighboring node of a grid point $p=(x_i, y_j)$, say the node to the right, $(x_{i+1}, y_j)$, lies in the hole. As noted, since the hole is entirely in one sub-region, then p can be on the border of at most three sub-regions.

a). Two Bordering Sub-Regions with Straight Borders. First, it is assumed that the point p only borders two sub-regions, $D_1$ and $D_2$, with resistivities of $\rho_1$ and $\rho_2$. See FIG. 8. That is, the resistivity in two adjoining rectangles is $\rho_1$, and in the other two it is $\rho_2$. Of course, if the point p only borders one region, $D_1$, then the following formulas are valid with $\rho_1=\rho_2$.

Figure 8:
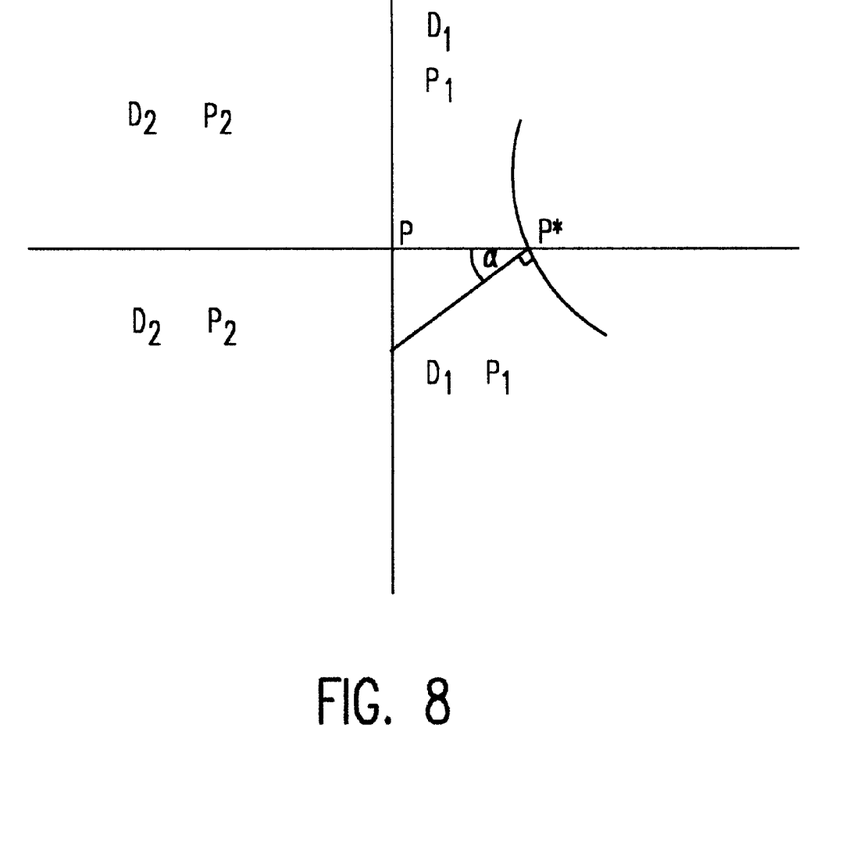
FIG. 8 is a diagram showing a grid point with one neighboring grid point in a hole bordering two sub-regions whose borders are a straight line.

Let $\zeta h_i$ denote the distance from p to the hole, and let p* be the point where the coordinate line $y=y_j$ to the right of p intersects the boundary of the hole. Also, let the normal at p* make an angle $\alpha$ with the x axis, and let $\mu$ be the radius of curvature of the boundary of the hole at p*. Then, we define:

$$s(m) = 1 + \frac{\zeta h_i m^2 \sqrt{1+m^2}}{\mu(1-m^2)} \quad (3)$$

$$t(m) = m - \frac{\zeta h_i m \sqrt{1+m^2}}{\mu(1-m^2)} \quad (4)$$

$$u(m) = -2\zeta h_i \frac{1+m^2}{1-m^2} \quad (5)$$

$$b(k) = \frac{k_{j+1}}{k_j k_{j+1} + k_j^2}$$

$$d(k) = -\frac{k_j}{k_{j+1}^2 + k_j k_{j+1}}$$

where $m = \tan \alpha$.

Figure 9:
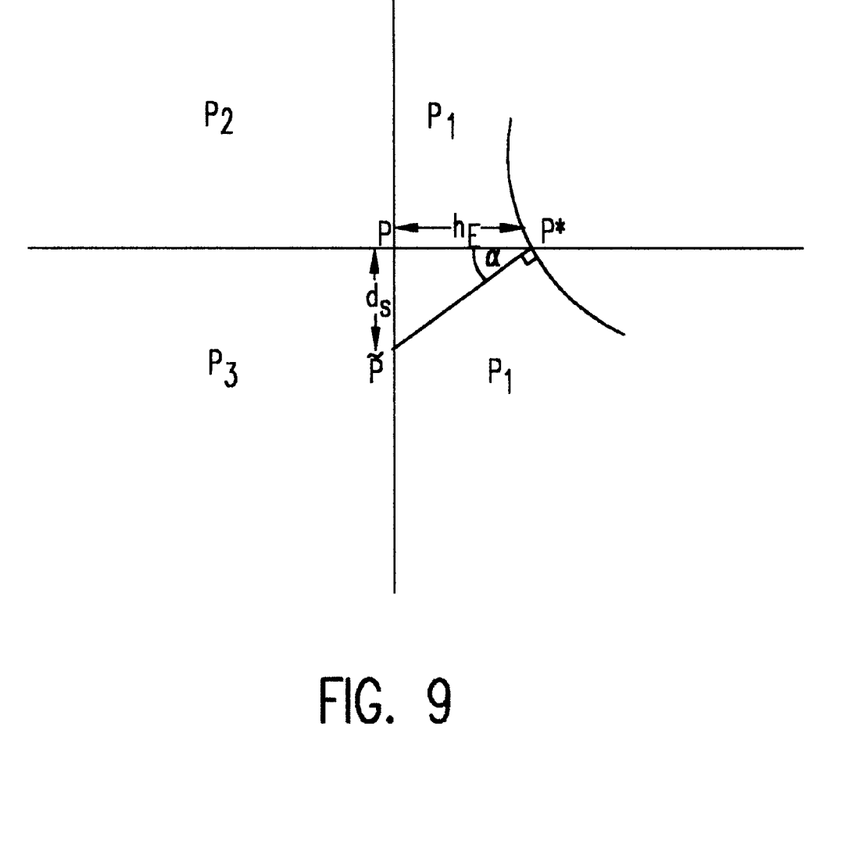
FIG. 9 is a diagram showing a grid point with one neighboring grid point i a hole bordering three sub-regions.
Figure 10:
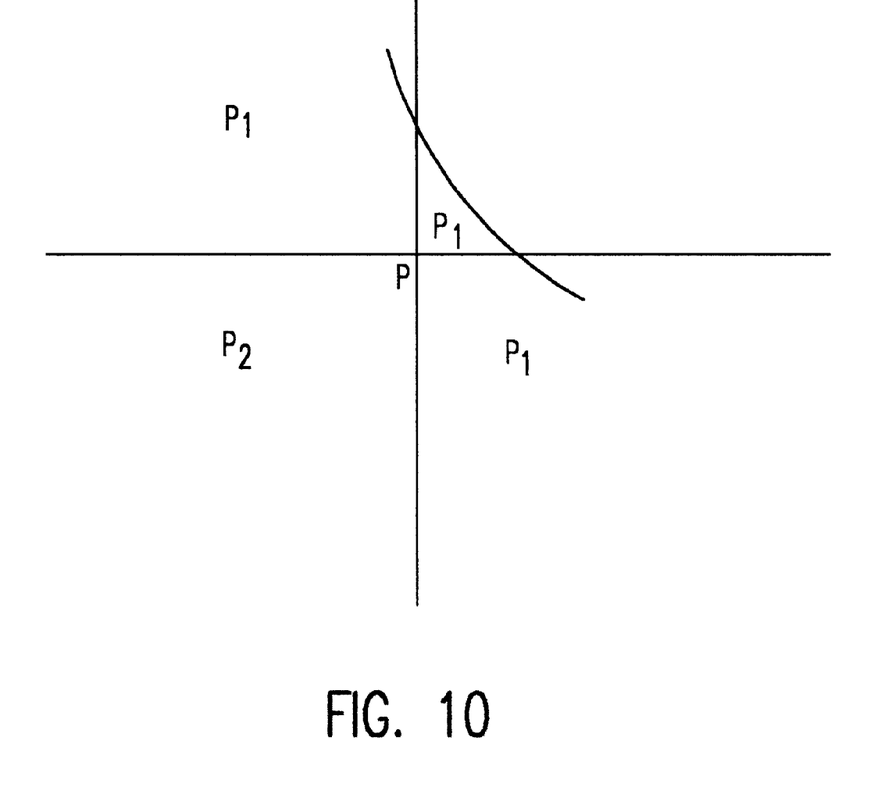
FIG. 10 is a diagram showing a grid pint with two neighboring grid points in a hole bordering regions with two different resistivities.

Then, at p the voltage satisfies the equation:

$$G_{i-1,j}(V_{i-1,j}-V_{ij}) + G_{ij+1}(V_{ij+1}-V_{ij}) + G_{ij-1}(V_{ij-1}-V_{ij}) = 0$$

with $$G_{i-1,j} = b(k)\left[\frac{s(m)h_i}{\rho_2} - \frac{1}{\rho_1}\left(\frac{u(m)}{k_{j+1}} + t(m)\right)\right]$$

$$G_{i,j+1} = \frac{s(m)}{\rho_2 h_i}$$

$$G_{i,j-1} = \frac{s(m)h_i}{\rho_2}\left(\frac{d(k)}{k_{j+1}} + \frac{1}{k_{j+1}^2}\right) - \frac{1}{\rho_1}\left[\left(\frac{d(k)}{k_{j+1}} + \frac{1}{k_{j+1}^2}\right)u(m) + d(k)t(m)\right]$$

b). Three Bordering Sub-Regions or Two Bordering Sub-Regions with Re-Entrant Corner. Now, suppose that the region surrounding $p=(x_i, y_j)$ is composed of three sub-regions $D_1$, $D_2$, and $D_3$ with resistivities $\rho_1$, $\rho_2$, and $\rho_3$, as in FIG. 9. We also use the following formula when there are two bordering sub-regions with a re-entrant corner, as in FIG. 10. In that case, $\rho_2$ is replaced by $\rho_1$. Let p* be the point where the line $y=y_j$ intersects the hole, and let $h_E$ be the distance between p and p*.

Let $\tilde{p}$ be the point where the line normal to the hole at p* intersects the line $x=x_i$. Assume $\tilde{p}$ lies at distance d below p. Then, define:

$$G_{i,j+1} = \frac{h_i + h_E}{(\rho_1+\rho_2)k_{j+1}}, \quad G_{i-1,j} = \frac{k_j + k_{j+1}}{(\rho_2+\rho_3)h_i}$$

$$a_1 = \frac{k_j + k_{j+1}}{2\rho_1 h_E}, \quad a_4 = \frac{h_i + h_E}{(\rho_1+\rho_3)k_j}, \quad d_s = \frac{d}{k_j}$$

$$G_{i,j-1} = a_4 + d_s a_1$$

Then, at p we require the voltage to satisfy the equation:

$$G_{i-1,j}(V_{i-1,j}-V_{i,j}) + G_{i,j+1}(V_{i,j+1}-V_{i,j}) + G_{i,j-1}(V_{i,j-1}-V_{i,j}) = 0$$

Figure 11:
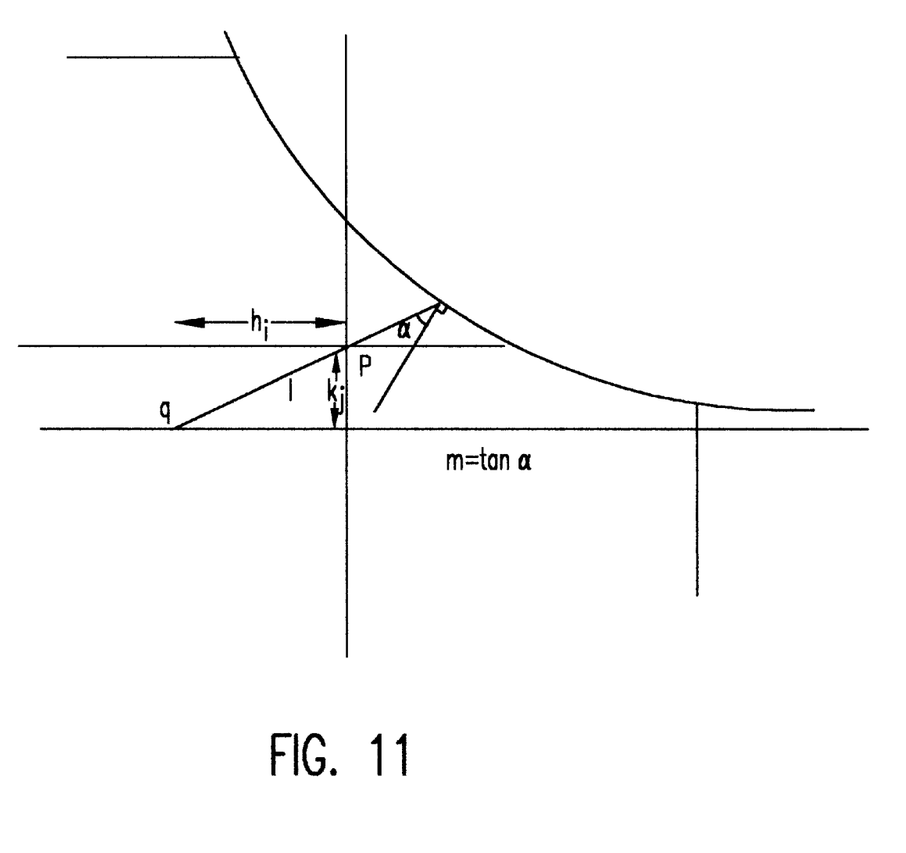
FIG. 11 is a diagram showing a grid point with two neighboring grid points, where a region surrounding the point has the same resistivity.

Two Neighboring Grid Points in Hole. Now, suppose that two of the neighboring nodes of p lie in a hole. For example, suppose it is the point above and the point to the right which lie outside the material. By the assumptions that the hole lies entirely in one sub-region and that interfaces between the sub-regions lie on grid lines, it follows that the region containing p and its four neighbors lies in at most two sub-regions, say with resistivities $\rho_1$ and $\rho_2$. See FIG. 10.

a). One Sub-Region. First, suppose that the region surrounding p is contained in one sub-region. Let r be the point where the line determined by the points $p=(x_i, y_j)$ and $q=(x_{i-1}, y_{j-1})$, denoted by 1, intersects the hole. Let m be the tangent of the angle that 1 makes with the normal to the hole at r. See FIG. 11. We then define:

$$\tilde{k}_{j+1} = \frac{h_i k_j}{\sqrt{h_i^2 + k_j^2}}, \quad \tilde{h}_i = \sqrt{k_j^2 - \tilde{k}_{j+1}}$$

$$\tilde{h}_{i+1} = \sqrt{h_i^2 - \tilde{k}_{j+1}}, \quad \tilde{k}_j = \frac{\tilde{h}_i k_j}{h_i}$$

$$\beta_1 = \frac{\sqrt{\tilde{h}_i^2 + \tilde{k}_i^2}}{h_i}, \quad \beta_2 = \frac{h_i - \beta_1}{h_i}$$

$$\tilde{a}(k) = -\frac{1}{\tilde{k}_{j+1} \tilde{k}_j}$$

$$\tilde{b}(k) = \frac{\tilde{k}_{j+1}}{\tilde{k}_j \tilde{k}_{j+1} + \tilde{k}_j^2}$$

$$\tilde{d}_k = -\frac{\tilde{k}_j}{\tilde{k}_{j+1}^2 + \tilde{k}_j \tilde{k}_{j+1}}$$

$$e_0 = \frac{2}{\tilde{h}_1 + \tilde{h}_{i+1}} + \frac{2}{\tilde{k}_j + \tilde{k}_{j+1}}$$

Let O denote the point where the line from the point (i−1,j) perpendicular to 1 intersects 1 and let $\zeta$ be the distance from O to r. Let $$s(m) = 1 + \frac{\zeta m^2 \sqrt{1+m^2}}{\mu(1-m^2)}$$

$$t(m) = m - \frac{\zeta \sqrt{1+m^2}}{\mu(1-m^2)}$$

$$u(m) = -2\zeta \frac{1+m^2}{1-m^2}$$

$$\tilde{c}_0 = \frac{s(m)}{\tilde{h}_i \rho_2}(\tilde{h}_i^2 \tilde{a}(k) - 1) - \frac{1}{\rho_1}\left(\tilde{a}(k)u(m) + \frac{(\tilde{k}_j - \tilde{k}_{j+1})}{\tilde{k}_j \tilde{k}_{j+1}}t(m)\right)$$

$$\tilde{c}_2 = \tilde{b}(k)\left[\frac{s(m)\tilde{h}_i}{\rho_2} - \frac{1}{\rho_1}\left(\frac{u(m)}{\tilde{k}_j+1} + t(m)\right)\right]$$

$$\tilde{c}_3 = \frac{s(m)}{\rho_2 \tilde{h}_i}$$

$$\tilde{c}_4 = \frac{s(m)\tilde{h}_i}{\rho_2}\left(\frac{\tilde{d}_k}{\tilde{k}_{j+1}} + \frac{1}{\tilde{k}_{j+1}^2}\right) - \frac{1}{\rho_1}\left[\left(\frac{\tilde{d}_k}{\tilde{k}_j+1} + \frac{1}{\tilde{k}_{j+1}^2}\right)u(m) + \tilde{d}(k)t(m)\right]$$

Figure 12:
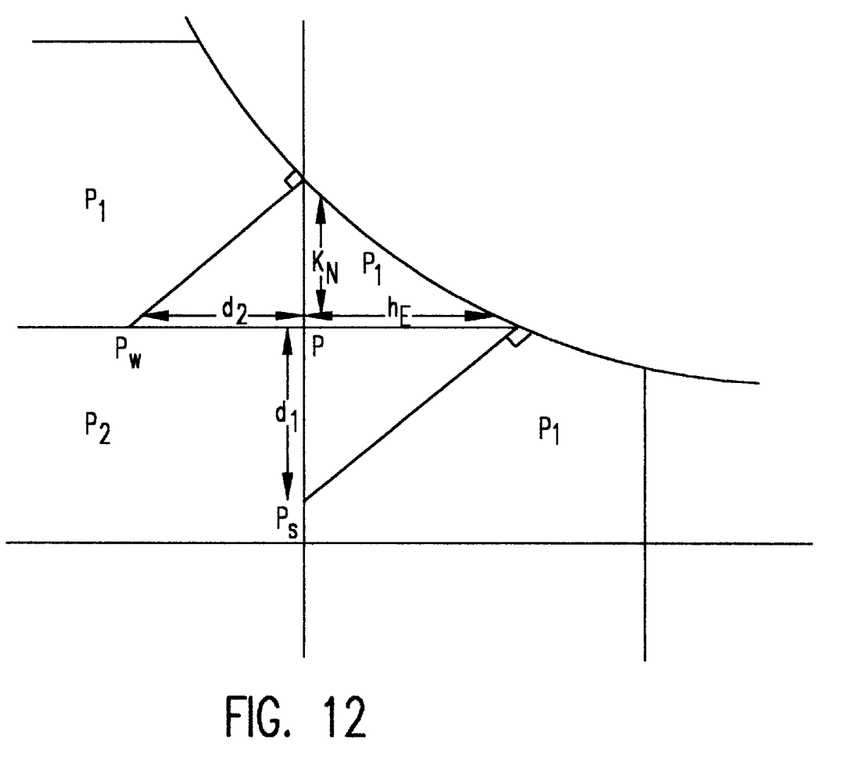
FIG. 12 is a diagram showing a grid point with two neighboring grid points in a hole bordering two sub-regions.

Then, at p the voltage satisfies the equation:

$$G_{i-1,j}(V_{i-1,j}-V_{i,j}) + G_{i-1,j-1}(V_{i-1,j-1}-V_{i,j}) + G_{i,j-1}(V_{i,j-1}-V_{i,j}) = 0$$

with $$G_{i-1,j-1} = \tilde{c}_2 - 2\left(\frac{1}{\tilde{h}_i(\tilde{h}_i + \tilde{h}_{i+1})} + \frac{\beta_2}{\tilde{k}_j(\tilde{k}_j + \tilde{k}_{j+1})}\right)\frac{\tilde{c}_0}{e_0}$$

$$G_{i-1,j} = \tilde{c}_3 - \frac{-2}{\tilde{k}_j(\tilde{k}_j + \tilde{k}_{j+1})}\frac{\tilde{c}_0}{e_0}$$

$$G_{i,j-1} = \tilde{c}_4 - \frac{-2\beta_1}{\tilde{k}_j(\tilde{k}_j + \tilde{k}_{j+1})}\frac{\tilde{c}_0}{e_0}$$

b) Two Sub-Regions. Suppose the region surrounding the point p is contained in two sub-regions with resistivities $\rho_1$ and $\rho_2$ as in FIG. 12.

Let:

$p^*_N$=the point where the line y=$y_j$ intersects the hole $p^*_E$=the point where the line x=$x_i$ intersects the hole $h_E$=the distance between p and $p^*_E$ $k_N$=the distance between p and $p^*_N$ $\tilde{p}_w$=the point the line normal to hole at $p^*_N$ intersects the line x=$x_i$ $\tilde{p}_S$=the point the line normal to hole at $p^*_S$ intersects the line y=$y_i$ $d_1$=the distance $\tilde{p}_S$ lies below p $d_2$=the distance $\tilde{p}_w$ lies to the left of p $d_s = d_1/k_j$ and $d_W = d_2/h_i$ Define:

$$a_1 = \frac{k_j + k_N}{2\rho_1 h_E}, \quad a_2 = \frac{h_i + h_E}{2\rho_1 k_N}$$

$$a_3 = \frac{k_j + k_N}{(\rho_1 + \rho_2)h_i}, \quad a_4 = \frac{h_i + h_E}{(\rho_1 + \rho_3)k_j}$$

Then, at p we require the voltage to satisfy the equation:

$$G_{i-1,j}(V_{i-1,j} - V_{i,j}) + G_{i,j-1}(V_{i,j-1} - V_{i,j}) = 0$$

where $G_{i-1,j} = a_3 + a_2 d_W$ and $G_{i,j-1} = a_4 + d_S a_1$.

After the system of voltage equations has been solved in accordance with the steps described above, a voltage distribution may be derived for the power supply network. From this voltage distribution, current and/or power distributions may be generated using conventional techniques.

In sum, the method of the present invention outperforms conventional methods in at least the following respects. First, the present method allows one to take advantage of an existing production code designed for rectangular geometries, and by only making minor changes to it, solve problems on regions of any shape. Another advantages is that the present method only requires the generation of a relatively coarse rectangular grid. This greatly reduces the setup and solution time for most problems. The method is also as accurate when a very fine rectangular grid is used near holes and contacts.

In addition, the matrix equations that arise in the solution of the problem are still of positive type and diagonally dominant, which means that one can continue to use rapid iterative methods, known as preconditioned conjugate gradient methods, for solving them. By using this method of approximation, the same level of accuracy can be achieved, with considerably less computational effort.

As noted, the method of the present invention as described herein is particularly well suited solving problems that are rectangular with a relatively small number of non-rectangular sub-regions. Therefore, it would be inefficient to develop a finite element code with triangular elements for solving them. This is particularly true since the regions often contain long, narrow holes. A finite element discretization would necessarily include triangles with a high aspect ratio. It is well known that the accuracy of finite element methods degrades in the neighborhood of such elements. Of course, those skilled in the art can appreciate that the method of the present invention also works well when there are many non-rectangular sub-regions.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A method for approximating a voltage distribution in a power supply network, said power supply network including a structure having at least one contact or hole with a non-rectangular boundary, said method including:

(a) parsing a resistive region of said structure into rectangles, each said rectangle being assigned a surface resistance;

(b) applying a grid over said parsed resistive region, said grid being based on locations of vertices of said rectangles;

(c) locating at least one grid point near said non-rectangular hole or contact;

(d) forming standard finite difference equations at points not near said non-rectangular holes or contacts, and modified finite difference equations at said at least one grid point located near said non-rectangular hole or contact, said modified finite difference equations being adapted to the specific geometry of each said non-rectangular hole or contact;

(e) solving said standard and modified difference equations; and (f) deriving a voltage distribution based on (e).

2. The method of claim 1, wherein step (b) includes applying said grid in such a manner that grid lines do not coincide with the non-rectangular boundary of said hole or contact.

3. The method of claim 1, wherein each of said rectangles is assigned a different surface resistance.

4. The method of claim 1, wherein points in said grid cover discontinuous material resistivity regions.

5. The method of claim 1, wherein said modified finite difference equations determine a resistance at said at least one non-rectangular grid point, from which a voltage value is derived.

6. The method of claim 1, wherein said adaptation to specific geometry includes construction of grid lines adapted to each of said at least one non-rectangular hole or contact.

7. The method of claim 6, wherein said modified finite difference equations solve elliptical differential equations on non-rectangular regions.

* * * * *